(12) United States Patent
Kim et al.

(10) Patent No.: US 7,732,825 B2
(45) Date of Patent: Jun. 8, 2010

(54) AC LIGHT EMITTING DIODE

(75) Inventors: Dae Won Kim, Seoul (KR); Yeo Jin Yoon, Ansan-si (KR); Dae Sung Kal, Seongnam-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/697,788

(22) Filed: Feb. 1, 2010

(65) Prior Publication Data

US 2010/0117101 A1 May 13, 2010

Related U.S. Application Data

(63) Continuation of application No. 12/515,869, filed as application No. PCT/KR2007/001215 on Mar. 13, 2007.

(51) Int. Cl.
*H01L 29/18* (2006.01)
*H01L 33/00* (2010.01)
(52) U.S. Cl. .............. 257/88; 257/89; 257/90; 257/82; 257/E21.381
(58) Field of Classification Search .......... 257/88, 257/89, 82, 90, E21.381
See application file for complete search history.

(56) References Cited

U.S. PATENT DOCUMENTS

| 6,547,249 | B2 | 4/2003 | Collins, III et al. |
|---|---|---|---|
| 7,213,942 | B2 | 5/2007 | Jiang et al. |
| 7,417,259 | B2 | 8/2008 | Sakai et al. |
| 2004/0075399 | A1 | 4/2004 | Hall |
| 2005/0225973 | A1 | 10/2005 | Eliashevich et al. |
| 2006/0163587 | A1 | 7/2006 | Erchak et al. |
| 2006/0163589 | A1 | 7/2006 | Fan et al. |
| 2007/0284598 | A1 | 12/2007 | Shakuda et al. |
| 2008/0179602 | A1 | 7/2008 | Negley et al. |
| 2009/0085048 | A1 | 4/2009 | Lee et al. |
| 2009/0278142 | A1 | 11/2009 | Watanabe et al. |
| 2009/0322241 | A1 | 12/2009 | Onushkin et al. |
| 2010/0032694 | A1* | 2/2010 | Kim et al. .................... 257/88 |

FOREIGN PATENT DOCUMENTS

| JP | 2002-016290 | 1/2002 |
|---|---|---|
| KR | 10-2005-0052474 | 6/2005 |
| KR | 10-2006-0020089 | 3/2006 |
| KR | 10-2006-0020572 | 3/2006 |

* cited by examiner

*Primary Examiner*—Zandra Smith
*Assistant Examiner*—Telly D Green
(74) *Attorney, Agent, or Firm*—H.C. Park & Associates, PLC

(57) ABSTRACT

Disclosed herein is an AC light emitting diode. The light emitting diode comprises a plurality of light emitting cells two-dimensionally arranged on a single substrate. Wires electrically connect the light emitting cells to one another to thereby form a serial array of the light emitting cells. Further, the light emitting cells are spaced apart from one another by distances within a range of 10 to 30 μm, and the serial array is operated while connected to an AC power source. Accordingly, the excellent operating characteristics and light output power can be secured in an AC light emitting diode with a limited size.

17 Claims, 3 Drawing Sheets

AC LIGHT EMITTING DIODE

CROSS REFERENCE TO RELATED APPLICATION

This application is a continuation of U.S. application Ser. No. 12/515,869 filed on May 21, 2009, which is the National Stage of International Application No. PCT/KR2007/001215, filed Mar. 13, 2007, which are hereby incorporated by reference for all purposes as if fully set forth herein.

BACKGROUND OF THE INVENTION

1. Field of the Invention

The present invention relates to a light emitting diode, and more particularly, to an AC light emitting diode capable of being operably connected directly to an AC power source.

2. Discussion of the Background

Light emitting diodes are an electroluminescence device having a structure in which n-type and p-type semiconductors are joined together, and emit predetermined light through recombination of electrons and holes. Such light emitting diodes have been used as display devices and backlights. Further, since the light emitting diodes have less electric power consumption and a longer life span as compared with conventional light bulbs or fluorescent lamps, their application areas have been expanded to the use thereof for general illumination while substituting for the conventional incandescent bulbs and fluorescent lamps.

A light emitting diode is repeatedly turned on/off depending on a direction of a current under AC power source. Thus, when a light emitting diode is used while connected directly to an AC power source, it cannot continuously emit light and may be easily damaged due to reverse current. Further, such a light emitting diode cannot be used while connected directly to a general AC power source, due to low operating voltage.

To solve such a problem of the light emitting diode, a method of positioning a rectifier between a light emitting diode and an AC power source to rectify AC current into DC current and then to operate the light emitting diode may be employed. However, the necessity of such a rectifier makes it difficult to substitute a light emitting diode for a lighting system such as a fluorescent lamp. Further, a method of connecting a plurality of light emitting diodes in reverse parallel with one another to connect the diodes directly to a high-voltage AC power source may be employed. However, since a large number of light emitting diodes should be operated while connected with one another, the overall size of a light emitting device is increased. Further, the number of processes such as wire connection is increased, because the light emitting diodes should be connected with one another.

SUMMARY OF THE INVENTION

The present invention is conceived to solve the aforementioned problems in the prior art. An object of the present invention is to provide an AC light emitting diode capable of being operably connected directly to an AC power source at a single chip level.

Another object of the present invention is to provide an AC light emitting diode in which light emitting cells are arranged within a chip of a limited size such that excellent operating characteristics and light outputs can be secured at the chip level.

A further object of the present invention is to provide an AC light emitting diode capable of preventing overvoltage from being applied to a specific light emitting cell during operation.

To achieve the objects of the present invention, an AC light emitting diode is provided. The AC light emitting diode according to the present invention comprises a plurality of light emitting cells two-dimensionally arranged on a single substrate. Further, wires electrically connect the light emitting cells to one another. A serial array of the light emitting cells is formed by means of the wires. The serial array is operated while connected to an AC power source. At this time, the serial array may include first and second serial arrays, and the first and second serial arrays may be operated while connected in reverse parallel to the AC power source. Further, a bridge rectifier may be configured by connecting some light emitting cells formed on the single substrate to one another through the wires. The serial array of light emitting cells is electrically connected to the bridge rectifier, so that it can be operated under AC power source. Accordingly, an AC light emitting diode capable of being operably connected to an AC power source is provided.

Furthermore, the light emitting cells are spaced apart from one another by distances within a range of 10 to 30 μm in longitudinal and transverse directions. In a case where the light emitting cells are spaced apart from one another by a distance less than 10 μm, a distance between the light emitting cells is too small. Since contaminated substances such as particles remain between the light emitting cells, current leakage may occur between the light emitting cells and it is also difficult to perform an etching process for separating the light emitting cells and a wiring process. In addition, a short circuit may occur between the wires. Alternatively, in a case where the light emitting cells are spaced apart from one another by a distance greater than 30 μm, the turn-on and operating voltages of the serial array of the light emitting cells are increased and the operating time of the light emitting cells is thus reduced. That is, in a case where the light emitting diode is operated under AC power source, a voltage applied to the serial array of the light emitting cells is changed in the form of a sine wave as the phase of the AC power is changed. At this time, if the turn-on and operating voltages of the serial array of the light emitting cells are high, the light emitting cells are turned on and then operated when the applied voltage is considerably increased. The light emitting cells are not operated when the applied voltage is low. Therefore, in a case where the turn-on and operating voltages are high, the operating time of the light emitting cells is shortened. As a result, an amount of light emitted from the light emitting diode is reduced. Further, since a time while the light emitting diode is turned off is lengthened, a flicker phenomenon is severe. Additionally, in a case where the light emitting cells are spaced apart from one another by a distance greater than 30 μm, a time while semiconductor layers are etched is lengthened and the etching damage may be induced to the light emitting cells due to long-time etching.

Although the distances between the light emitting cells in the transverse direction may be generally identical with one another, the present invention is not limited thereto and but the distances may be different from one another within the aforementioned range. Similarly, although the distances between the light emitting cells in the longitudinal direction may be generally identical with one another, the present invention is not limited thereto and but the distances may be different from one another within the aforementioned range.

Meanwhile, each of the light emitting cells comprises a first conductive type semiconductor layer formed on the substrate, a second conductive type semiconductor layer positioned on one region of the first conductive type semiconductor layer, and an active layer interposed between the first and second conductive type semiconductor layers. Each of the first and second conductive type semiconductor layers and the active layer may be formed of a group III-V compound semiconductor, particularly an (Al, In, Ga)N-based nitride semiconductor. Each of the wires electrically connects a first conductive type semiconductor layer of one light emitting cell to a second conductive type semiconductor layer of the other adjacent light emitting cell to thereby form the serial array of the light emitting cells.

Furthermore, at least one shunt wire may electrically connect corresponding wires of the first and second serial arrays operably connected in reverse parallel to each other. The shunt wire prevents overvoltage from being applied to a specific light emitting cell in the serial array to which reverse voltage is applied when the AC light emitting diode is operated.

The at least one shunt wire may be made of the same material as the wires and may be formed together with the wires. Further, the at least one shunt wire may be positioned between the light emitting cells.

In addition, a transparent electrode layer may be formed on the second conductive type semiconductor layer of each of the light emitting cells. The transparent electrode layer allows current to be uniformly distributed over the second conductive type semiconductor layer and light generated in the active layer to be radiated upward through the second conductive type semiconductor layer.

Moreover, a reflection layer may be formed on the second conductive type semiconductor layer of each of the light emitting cells. Further, the light emitting cells are flip-bonded on a submount substrate through metal bumps. The reflection layer is employed to reflect light which is generated in the active layer and then travels toward the submount substrate.

To bond the metal bumps on the submount substrate, bonding patterns may be formed on the submount substrate. Further, the wires may be configured using the bonding patterns formed on the submount substrate.

According to the present invention, an AC light emitting diode capable of being continuously operated while connected to an AC power source can be provided. Further, spacing distances between light emitting cells are set within a range of 10 to 30 μm, and thus, turn-on and operating voltages can be lowered to thereby increase the light emitting time of the light emitting diode under AC power source. Accordingly, an amount of light emitted from the light emitting diode can be increased, and a flicker phenomenon of the AC light emitting diode can be reduced. Furthermore, since the light emitting cells are arranged at a spacing distance of 10 μm or more, the light emitting cells can be easily separated from one another, wires for connecting the light emitting cells to one another can be easily formed, and a short circuit occurring between the wires can be prevented. In addition, since the light emitting cells are arranged at a spacing distance of 30 μm or less, an etching time required to form the light emitting cells can be reduced and the etching damage which may be induced to the light emitting cells can also be reduced.

DETAILED DESCRIPTION OF THE ILLUSTRATED EMBODIMENTS

Figure 1:
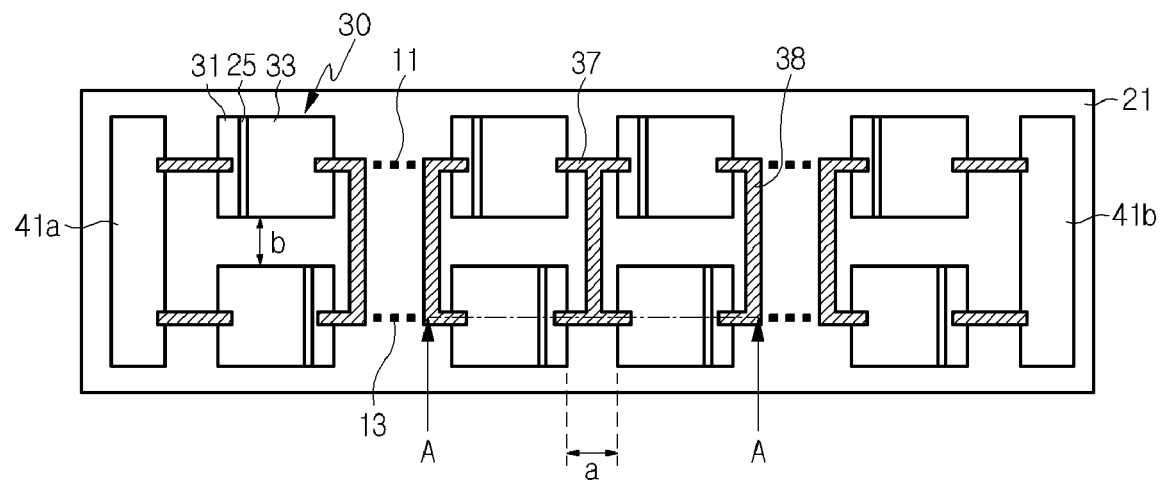
FIG. 1 is a plan view illustrating an AC light emitting diode according to an embodiment of the present invention.

Hereinafter, preferred embodiments of the present invention will be described in detail with reference to the accompanying drawings. The following embodiments are provided only for illustrative purposes to fully convey the spirit of the present invention to those skilled in the art. Therefore, the present invention is not limited to the following embodiments but may be implemented in other forms. In the drawings, the widths, lengths, thicknesses and the like of elements are exaggerated for convenience of illustration Like reference numerals indicate like elements throughout the specification and drawings.

Figure 2:
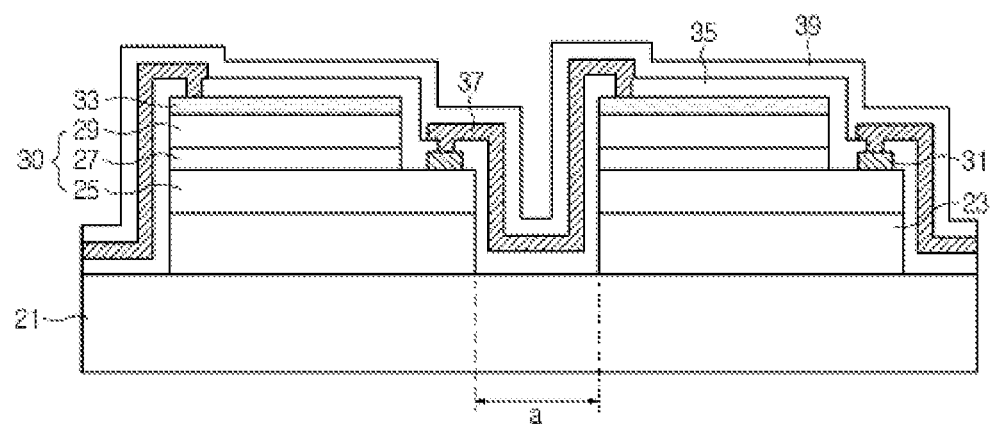
FIG. 2 is a sectional view taken along line A-A in FIG. 1.

FIG. 1 is a plan view illustrating an AC light emitting diode according to an embodiment of the present invention, and FIG. 2 is a sectional view taken along line A-A in FIG. 1.

Referring to FIGS. 1 and 2, a plurality of light emitting cells 30 are arranged on a substrate 21. The substrate 21 generally has a limited size, e.g. a size of 2000×2000 $\mu m^2$ or less. The size of the substrate 21 means the size of a single chip. Currently, the standard of such a single chip is set within a range of the aforementioned size.

Each of the light emitting cells 30 comprises a first conductive type semiconductor layer 25, a second conductive type semiconductor layer 29 positioned on one region of the first conductive type semiconductor layer 25, and an active layer 27 interposed between the first and second conductive type semiconductor layers 25 and 29. Each of the first and second conductive type semiconductor layers 25 and 29 and the active layer 27 may be formed of a group III-V compound semiconductor, particularly (Al, In, Ga)N. The light emitting cells 30 are formed on a buffer layer 23. At this time, the light emitting cells 30 are arranged to be spaced apart from one another by distances "a" and "b" within a range of 10 to 30 μm in the longitudinal and transverse directions. Here, although the spacing distances "a" between the light emitting cells 30 in the transverse direction may generally have the same values as one another, the present invention is not limited thereto but they may have different values. Further, although the spacing distances "b" between the light emitting cells 30 in the longitudinal direction may generally have the same values as one another, the present invention is not limited thereto but they may have different values.

The light emitting cells 30 are electrically connected to one another through wires 37. Each wire 37 connects a first conductive type semiconductor layer 25 of one light emitting cell 30 to a second conductive type semiconductor layer 29 of an adjacent light emitting cell 30. At this time, a first electrode pad 31 may be formed on the first conductive type semiconductor layer 25, and a transparent electrode layer 33 may be formed on the second conductive type semiconductor layer 29. The transparent electrode layer 33 may be formed of a material such as indium tin oxide (ITO) or Ni/Au. In general, in a case where the second conductive type semiconductor layer 29 is formed of a P-type semiconductor with larger resistance, the transparent electrode layer 33 allows current to be uniformly distributed over the second conductive type semiconductor layer 29. Further, since the transparent electrode layer 33 is transparent to light generated from the active layer 27, the light may be emitted upward through the second conductive type semiconductor layer 29.

As shown in the figures, each wire 37 connects the first electrode pad 31 and the transparent electrode layer 33 to each other such that the first and second conductive type semiconductor layers 25 and 29 can be electrically connected to each other. A second electrode pad (not shown) may be further formed on the transparent electrode layer 33, and the wire 37 may be connected to the transparent electrode layer 33 through the second electrode pad. Meanwhile, an insulation layer 35 is interposed between the light emitting cell 30 and the wire 37 to prevent the first and second conductive type semiconductor layers 25 and 29 in the light emitting cell 30 from being shorted due to the wires 37. The insulation layer 35 may be formed by depositing $SiO_2$, $Si_3N_4$ or the like on the entire surface of the substrate with the light emitting cells 30, the transparent electrode layers 33, the first electrode pad 31 and the like formed thereon. The insulation layer is patterned such that the transparent electrode layer 33 and the first electrode pad 31 are exposed. Each of the wires 37 is formed on the insulation layer 35 such that the exposed transparent electrode layer and first conductive pad 31 are connected to each other.

First and second serial arrays 11 and 13 each having the light emitting cells 30 connected in series with each other are formed by means of the wires 37. In operation, the first and second serial arrays 11 and 13 are operated while connected in reverse parallel with an AC power source (not shown). Therefore, the first and second serial arrays 11 and 13 are alternately operated in accordance with the phase change of the AC power source, and thus, the light emitting diode can continuously emit light.

Meanwhile, at least one shunt wire 38 electrically connects corresponding light emitting cells 30 in the first and second serial arrays 11 and 13 to each other. The shunt wire 38 allows the corresponding light emitting cells 30 of the first and second serial arrays 11 and 13 to have the same potential as each other. Accordingly, in a case where the serial arrays 11 and 13 connected in reverse parallel are operated under AC power source, the light emitting cells 30 can be protected by preventing overvoltage from being applied to a specific light emitting cell 30 in the serial array to which a reverse voltage is applied. The shunt wire 38 may electrically connect most of the light emitting cells 30 to one another such that all the corresponding light emitting cells 30 of the first and second arrays 11 and 13 have the same potential as each other. However, the present invention is not limited thereto but only some light emitting cells 30 may be connected to one another.

The shunt wires 38 may be positioned between the light emitting cells 30 and may connect the corresponding wires 37 in the first and second serial arrays 11 and 13 to each other as shown in the figures. Further, the shunt wires 38 may be formed together with the wires 37 using the same material and process as the wires 37.

Meanwhile, in order to connect the light emitting diode to an AC power source, pads 41a and 41b are formed on the substrate 21. The first and second serial arrays 11 and 13 may be connected in reverse parallel to the pads 41a and 41b.

Additionally, to protect the wires 37 and the light emitting cells 30, a protection layer 39 may be formed on the substrate 21 with the wires 37 formed thereon. The protection layer 39 may be formed of $SiO_2$, $Si_3N_4$ or the like.

In this embodiment, the light emitting cells 30 are spaced apart from one another by distances "a" and "b" within a range of 10 to 30 μm in the longitudinal and transverse directions. In a case where the light emitting cells 30 are spaced apart from one another by a distance less than 10 μm, it is difficult to perform an etching process for electrically isolating the light emitting cells 30 from one another. Since contaminated substances such as particles remain between the light emitting cells 30, the current leakage may occur between the light emitting cells 30. Further, in a case where a distance between the light emitting cells 30 is less than 10 μm, it is difficult to form the insulation layers 35 and the wires 37 and a short circuit may occur between the wires 37. Accordingly, the light emitting cells 30 are spaced apart from one another by 10 μm or more, so that the light emitting cells 30 can be easily formed using an etching technique, and the insulating layers 35, the wires 37 and the shunt wires 38 can also be easily formed. Additionally, the occurrence of current leakage between the light emitting cells 30 can be prevented. Meanwhile, in a case where the light emitting cells 30 are spaced apart from one another by a distance greater than 30 μm, turn-on voltage of the serial array is excessively increased and an operating time of the AC light emitting diode is thus reduced. Therefore, an amount of light emitted from the light emitting diode may be reduced, and a flicker phenomenon may be severe. Further, while the light emitting cells 30 are formed by etching the semiconductor layers, an etching time is excessively increased and the etching damage may be induced. Therefore, a distance between the light emitting cells 30 is limited to 30 μm or less, so that the flicker phenomenon of the AC light emitting diode can be prevented and the etching damage which may be induced to the light emitting cells 30 can be reduced.

Meanwhile, although it has been described in this embodiment that the first and second serial arrays 11 and 13 are operably connected in reverse parallel to one another, a single serial array connected in series through wires may be formed on a single substrate. At this time, a bridge rectifier may be formed on the substrate and the serial array may also be connected to the bridge rectifier such that the serial array can be operated under AC power source. In addition, the bridge rectifier may be formed by connecting the light emitting cells 30 formed on the single substrate 21 to one another using wires.

Figure 3:
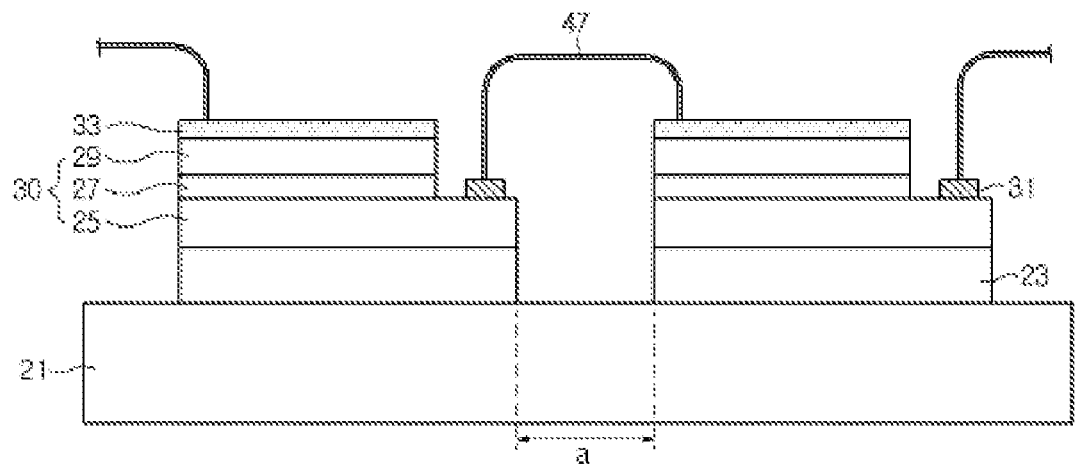
FIG. 3 is a sectional view illustrating an AC light emitting diode according to another embodiment of the present invention.

FIG. 3 is a sectional view illustrating an AC light emitting diode according to another embodiment of the present invention.

Referring to FIG. 3, a plurality of light emitting cells 30 are two-dimensionally arranged on a substrate 21 as described with reference to FIGS. 1 and 2. Further, a transparent electrode layer 33 may be formed on a second conductive type semiconductor layer 29 of each of the light emitting cells 30, and a first electrode pad 31 may be formed on a first conductive type semiconductor layer 25 of each of the light emitting cells 30. In addition, wires 47 electrically connect the light emitting cells 30 to one another to thereby form serial arrays. In this embodiment, however, the wires 47 that connect the light emitting cells 30 to one another are formed using an air bridge process unlike the wires 37 described with reference to FIG. 2. A portion of each wire 47 except contact portions thereof is positioned to be separated from the substrate. Shunt wires (not shown) for connecting the light emitting cells 30 between the serial arrays may be formed together with the air bridge wires 47. Meanwhile, since the air bridge wires 47 are positioned to be separated from the respective light emitting cells 30, an insulating layer 35 for preventing the first and second conductive type semiconductor layers 25 and 29 of each light emitting cell 30 from being shorted due to the wires 47 may be omitted in this embodiment.

In this embodiment, the light emitting cells 30 are also arranged to be spaced apart from one another by distances within a range of 10 to 30 μm in the longitudinal and transverse directions as described with reference to FIGS. 1 and 2.

Figure 4:
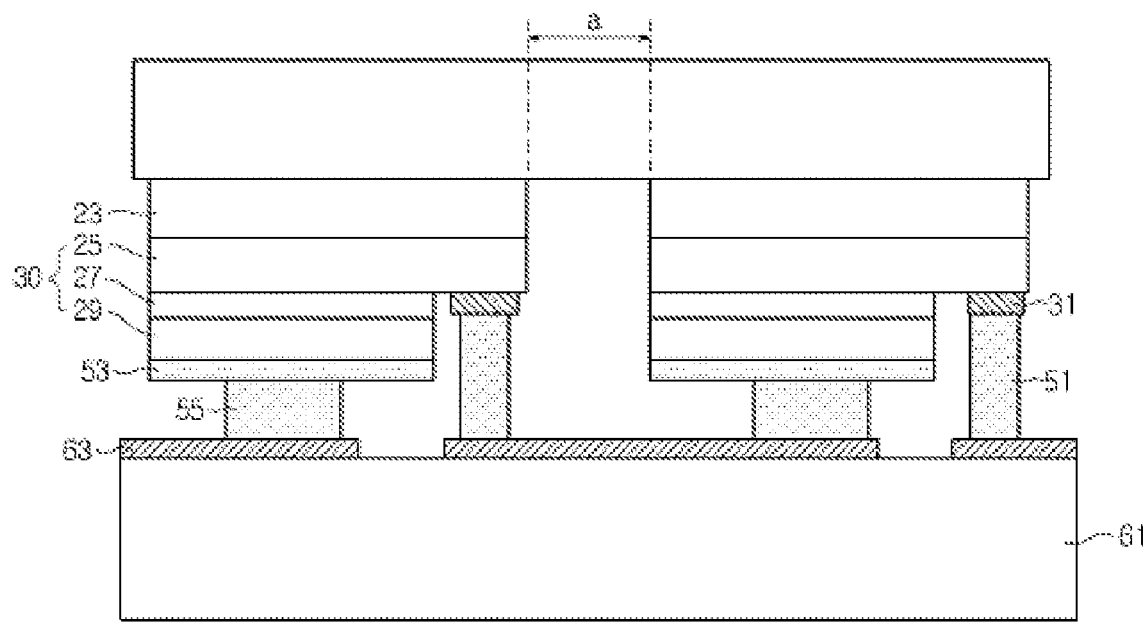
FIG. 4 is a sectional view illustrating an AC light emitting diode according to a further embodiment of the present invention.

FIG. 4 is a sectional view illustrating an AC light emitting diode according to a further embodiment of the present invention.

Referring to FIG. 4, a plurality of light emitting cells 30 are two-dimensionally arranged on a substrate 21 as described with reference to FIG. 3. In this embodiment, however, metal bumps 51 and 55 are formed on first and second conductive type semiconductor layers 25 and 29, respectively, and the light emitting cells 30 are flip-bonded onto a submount substrate 61 through the metal bumps 51 and 55. At this time, a reflection layer 53 is formed on the second conductive type semiconductor layer 29 to reflect light generated from an active layer 27 and traveling toward the submount substrate 61. Further, a first electrode pad 31 may be interposed between the metal bump 51 and the first conductive type semiconductor layer 25.

Furthermore, bonding patterns 63 may be formed on the submount substrate 61 to bond the metal bumps 51 and 55 thereon. In addition, pads (not shown) for electrically connecting the light emitting diode to an AC power source may be formed on the submount substrate 61. As shown in this figure, the light emitting cells 30 are flip-bonded in such a manner that a first conductive type semiconductor layer 25 of one light emitting cell 30 and a second conductive type semiconductor layer 29 of an adjacent light emitting cell 30 are electrically bonded onto a single bonding pattern 63, so that the light emitting cells 30 can be connected in series to one another using the bonding patterns 63. That is, the bonding patterns 63 may function as wires for connecting the light emitting cells 30 to one another. Accordingly, the light emitting cells 30 are connected by means of the bonding patterns 63, so that first and second serial arrays 11 and 13 (FIG. 1) can be formed.

In this embodiment, since the light emitting cells 30 are flip-bonded on the submount substrate 61, heat produced from the light emitting cells 30 in operation is dissipated through the submount substrate 61, and thus, the luminous efficiency can be enhanced.

Meanwhile, although it has been described in this embodiment that the light emitting cells 30 are connected in series to one another by means of the bonding patterns 63, the present invention is not limited thereto. That is, wires 37 (FIG. 2) or 47 (FIG. 3) for electrically connecting the light emitting cells 30 to one another may be additionally formed and the light emitting cells 30 may be flip-bonded to the corresponding bonding patterns 63 through the wires 37 or 47, respectively. In such a case, the metal bumps 51 formed on the first conductive type semiconductor layers 25 may be omitted.

Figure 5:
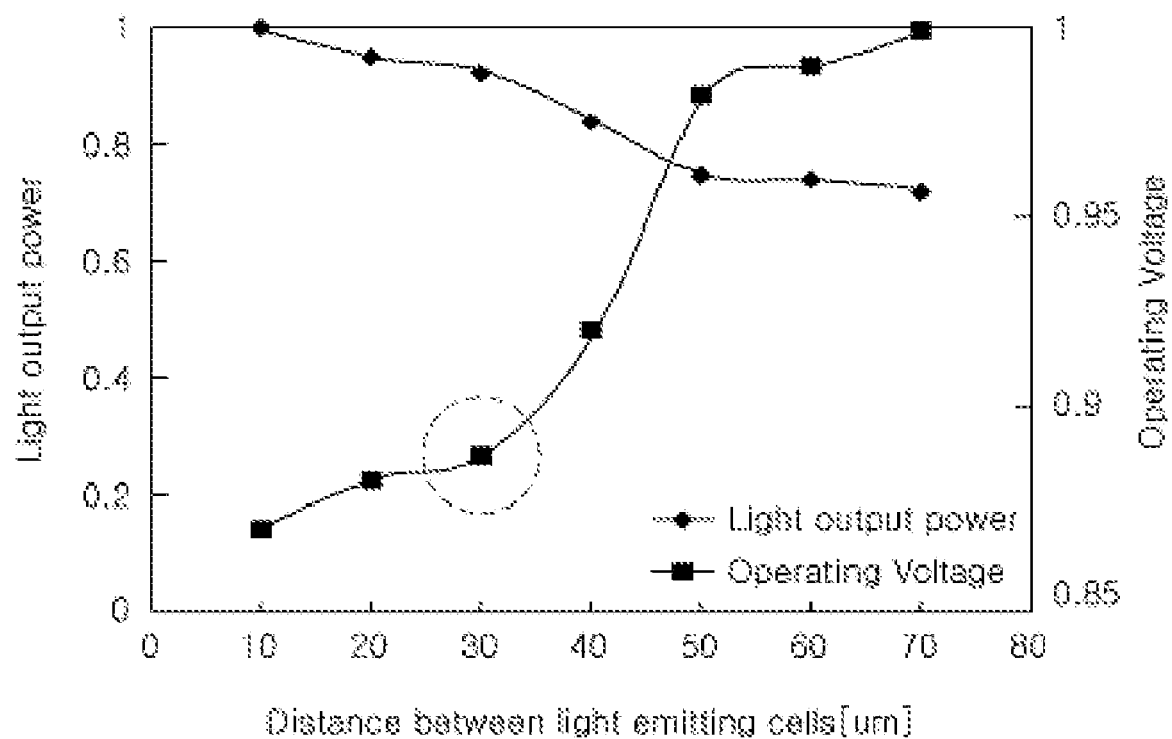
FIG. 5 is a graph plotting a light output and an operating voltage depending on spacing distances between light emitting cells.

FIG. 5 is a graph plotting light output power and operating voltage depending on spacing distances between light emitting cells 30. Here, the light emitting cells 30 are formed equal in number on a substrate 21 with the same size. Wires of FIG. 2 are formed to electrically connect the light emitting cells 30 to one another, so that a serial array can be formed. The operating voltage refers to a voltage applied to the serial array when a current of 20 mA flows through the serial array of the light emitting cells 30.

Referring to FIG. 5, as the distances between the light emitting cells 30 increase, the operating voltage of the serial array is increased and the light output power thereof is decreased. Further, the operating voltage is slowly increased while the distance between the light emitting cells 30 increases from 10 to 30 μm. However, the operating voltage is rapidly increased when the distance increases above 30 μm. It is determined that as the adjacent light emitting cells 30 are spaced apart from each other by 30 μm or more, the size of each of the light emitting cells 30 is decreased and the excessive etching damage of the light emitting cells occurs while the light emitting cells 30 are formed.

What is claimed is:

1. A light emitting diode, comprising:
   a first array of light emitting cells arranged on a substrate; and
   a wire to connect the light emitting cells to one another,
   wherein the first array comprises at least two light emitting cells connected in series to one another through the wire,
   wherein one light emitting cell is spaced apart from a first adjacent light emitting cell in a first direction by a distance in a range of 10 μm to 30 μm,
   wherein the one light emitting cell is spaced apart from a second adjacent light emitting cell in a second direction substantially perpendicular to the first direction by a distance in a range of 10 μm to 30 μm, and
   wherein the light emitting diode is configured to operate on alternating current (AC) power.

2. The light emitting diode of claim 1, further comprising an insulation layer arranged between the wire and the light emitting cells.

3. The light emitting diode of claim 2, wherein the insulation layer comprises silicon oxide or silicon nitride.

4. The light emitting diode of claim 1, further comprising a protection layer arranged on the wire.

5. The light emitting diode of claim 4, wherein the protection layer comprises silicon oxide or silicon nitride.

6. The light emitting diode of claim 1, wherein a distance between a first light emitting cell and a second light emitting cell is different from a distance between a third light emitting cell and a fourth light emitting cell.

7. The light emitting diode of claim 1, further comprising a second array,
   wherein the second array comprises at least two light emitting cells connected in series to one another through a wire.

8. The light emitting diode of claim 7, wherein the first array and the second array are configured to operate on AC power.

9. The light emitting diode of claim 8, further comprising:
   a shunt wire electrically connecting the wire of the first array to the wire of the second array.

10. The light emitting diode of claim 9, wherein the shunt wire comprises the same material as the wire of the first array and the wire of the second array.

11. The light emitting diode of claim 10, wherein the shunt wire, the wire of the first array, and the wire of the second array are formed using a first process.

12. The light emitting diode of claim 1, further comprising:
    pads arranged on the substrate to connect the light emitting diode to an AC power source.

13. The light emitting diode of claim 12, wherein the pads and the light emitting cells comprise an overall tetragonal shape.

14. The light emitting diode of claim 1, further comprising:
    a bridge rectifier arranged on the substrate.

15. The light emitting diode of claim 14, wherein the bridge rectifier comprises at least two light emitting cells connected to one another through a wire.

16. The light emitting diode of claim 14, wherein the first array is connected to the bridge rectifier.

17. The light emitting diode of claim 15, wherein the first array is connected to the bridge rectifier.

* * * * *